(12) United States Patent
Dinh et al.

(10) Patent No.: US 9,583,445 B2
(45) Date of Patent: Feb. 28, 2017

(54) METAL ELECTROMAGNETIC INTERFERENCE (EMI) SHIELDING COATING ALONG AN EDGE OF A CERAMIC SUBSTRATE

(71) Applicant: Apple Inc., Cupertino, CA (US)

(72) Inventors: Richard H. Dinh, San Jose, CA (US); Ashutosh Y. Shukla, Santa Clara, CA (US); Scott A. Myers, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 52 days.

(21) Appl. No.: 14/218,384

(22) Filed: Mar. 18, 2014

(65) Prior Publication Data

US 2015/0270227 A1   Sep. 24, 2015

(51) Int. Cl.
| | |
|---|---|
| H01L 23/552 | (2006.01) |
| H01L 27/146 | (2006.01) |
| H01L 23/498 | (2006.01) |
| H05K 1/02 | (2006.01) |
| H05K 1/18 | (2006.01) |
| H01L 23/13 | (2006.01) |
| H01L 23/15 | (2006.01) |
| H01L 23/00 | (2006.01) |
| H05K 3/00 | (2006.01) |
| H05K 3/36 | (2006.01) |

(52) U.S. Cl.
CPC ...... *H01L 23/552* (2013.01); *H01L 23/49805* (2013.01); *H01L 23/49827* (2013.01); *H01L 23/49838* (2013.01); *H01L 27/14618* (2013.01); *H05K 1/0218* (2013.01); *H01L 23/13* (2013.01); *H01L 23/15* (2013.01); *H01L 24/13* (2013.01); *H01L 24/16* (2013.01); *H01L 24/81* (2013.01); *H01L 2224/0401* (2013.01); *H01L 2224/131* (2013.01); *H01L 2224/16225* (2013.01); *H01L 2224/16235* (2013.01); *H01L 2224/16238* (2013.01); *H01L 2224/81801* (2013.01); *H01L 2924/12041* (2013.01); *H01L 2924/12042* (2013.01); *H01L 2924/12044* (2013.01); *H01L 2924/14* (2013.01); *H01L 2924/15151* (2013.01); *H01L 2924/15159* (2013.01); *H01L 2924/15162* (2013.01);
(Continued)

(58) Field of Classification Search
CPC . H01L 23/5384; H01L 23/552; H01L 23/585; H05K 1/0216; H05K 1/0306; H05K 1/115; H05K 1/181; H05K 1/189
See application file for complete search history.

(56) References Cited

U.S. PATENT DOCUMENTS 5,586,011 A    12/1996  Alexander
5,966,052 A *  10/1999  Sakai ............... H01L 23/49805
                                              257/E23.061
(Continued)

*Primary Examiner* — Anh Mai
(74) *Attorney, Agent, or Firm* — Treyz Law Group, P.C.; G. Victor Treyz; Joseph F. Guihan

(57) ABSTRACT

An electrical component may be mounted on a substrate such as a ceramic substrate. Contacts may be formed on upper and lower surfaces of the substrate. The electrical component may be soldered to the contacts on the upper surface. The contacts on the lower surface may be used to solder the substrate to a printed circuit. During manufacturing, it may be desirable to use metal traces on a ceramic panel to make connections to contacts on the substrate. Following singulation of the ceramic panel to form the ceramic substrate, some of the metal traces may run to the edge of the ceramic substrate. A folded tab of the printed circuit may form a shield that covers these exposed traces. A divided metal-coated groove or a row of divided metal-coated vias running along each edge of the substrate may also provide shielding.

15 Claims, 16 Drawing Sheets

(52) U.S. Cl.
CPC ............... *H01L 2924/15311* (2013.01); *H01L 2924/15787* (2013.01); *H05K 1/189* (2013.01); *H05K 3/0052* (2013.01); *H05K 3/363* (2013.01); *H05K 2201/053* (2013.01); *H05K 2201/056* (2013.01); *H05K 2201/09145* (2013.01); *H05K 2201/09354* (2013.01); *H05K 2201/09509* (2013.01); *H05K 2201/09618* (2013.01); *H05K 2201/10378* (2013.01); *H05K 2201/2018* (2013.01)

(56) References Cited

U.S. PATENT DOCUMENTS

| | | | |
|---|---|---|---|
| 6,383,835 B1 * | 5/2002 | Hata | H01L 24/97 257/433 |
| 7,506,436 B2 | 3/2009 | Bachman | |
| 8,178,956 B2 | 5/2012 | Do et al. | |
| 8,654,537 B2 | 2/2014 | Fisher, Jr. et al. | |
| 2009/0302437 A1 * | 12/2009 | Kim | H01L 21/561 257/659 |
| 2011/0255250 A1 | 10/2011 | Dinh et al. | |
| 2012/0000699 A1 * | 1/2012 | Inoue | H01L 23/29 174/257 |
| 2012/0140423 A1 * | 6/2012 | Fisher, Jr. | H05K 3/284 361/748 |
| 2012/0188727 A1 | 7/2012 | Lin et al. | |
| 2012/0228749 A1 * | 9/2012 | Pagaila | H01L 23/147 257/659 |
| 2013/0087895 A1 * | 4/2013 | Upadhyayula | H01L 23/3135 257/659 |
| 2013/0223041 A1 * | 8/2013 | Arnold | H01L 23/552 361/818 |
| 2014/0028518 A1 | 1/2014 | Arnold et al. | |

\* cited by examiner

METAL ELECTROMAGNETIC INTERFERENCE (EMI) SHIELDING COATING ALONG AN EDGE OF A CERAMIC SUBSTRATE

BACKGROUND

This relates generally to substrates on which electronic components in electronic devices are mounted, and, more particularly, to shielding such substrates to prevent electromagnetic interference.

Electronic devices include components such as sensors, integrated circuits, and other electrical components. These components are mounted on substrates. To prevent electromagnetic interference, substrates are sometimes shielded with metal shielding cans. In some situations, the entire edge of a printed circuit board substrate may be shielded by folding up a locally thinned portion of a flexible printed circuit that contains ground traces so that the ground traces cover the edge.

Shielding structures such as these may be unable to block electromagnetic interference from certain substrates, may consume more volume within a device than desired, and may be unreliable and difficult to manufacture.

It would therefore be desirable to be able to provide improved techniques for providing substrates and components mounted to the substrates with electromagnetic interference shielding.

SUMMARY

An electronic device may have electrical components such as integrated circuits and other components. An electrical component may be mounted on a substrate such as a ceramic substrate. The ceramic substrate may be used to mount the electrical component to a printed circuit such as a flexible printed circuit.

The ceramic substrate may have a rectangular central opening surrounded by a ring-shaped ceramic member. Contacts may be formed on the upper and lower surfaces of the substrate. The electrical component may be soldered to the contacts on the upper surface. The contacts on the lower surface may be used to solder the substrate to mating contacts on the printed circuit.

During manufacturing, it may be desirable to use metal traces on a ceramic panel to make connections to contacts on the substrate. Following singulation of the ceramic panel to form the ceramic substrate, some of the metal traces may run to the edge of the ceramic substrate. A folded tab of the printed circuit may form a shield that covers these exposed traces. Along other portions of the edges of the substrate, electromagnetic interference shielding may be formed from a metal-coated notch or a row of metal-coated vias.

DETAILED DESCRIPTION

Electronic devices may be provided with electrical components such as sensors, integrated circuits, light-emitting diodes and other components that emit light, light detectors, cameras, buttons, speakers, microphones, vibrators, tone generators, communications circuitry, and other electrical components. These components may be mounted on substrates such as ceramic substrates, printed circuits, plastic structures, and other substrate structures. In turn, the ceramic substrate to which an electrical component has been mounted may be attached to another substrate such as a printed circuit substrate. The printed circuit to which the ceramic substrate is mounted may be a rigid printed circuit (e.g., a printed circuit formed from fiberglass-filled epoxy or other rigid printed circuit board material) or a flexible printed circuit (e.g., a printed circuit formed from a sheet of polyimide or a layer of other flexible polymer). Electromagnetic interference shielding may be used to reduce electromagnetic interference in the components of an electronic device. For example, a substrate to which an electrical component such as an integrated circuit has been mounted may be provided with edge shielding structures that help block electromagnetic interference signals along the edges of the substrate.

Figure 1:
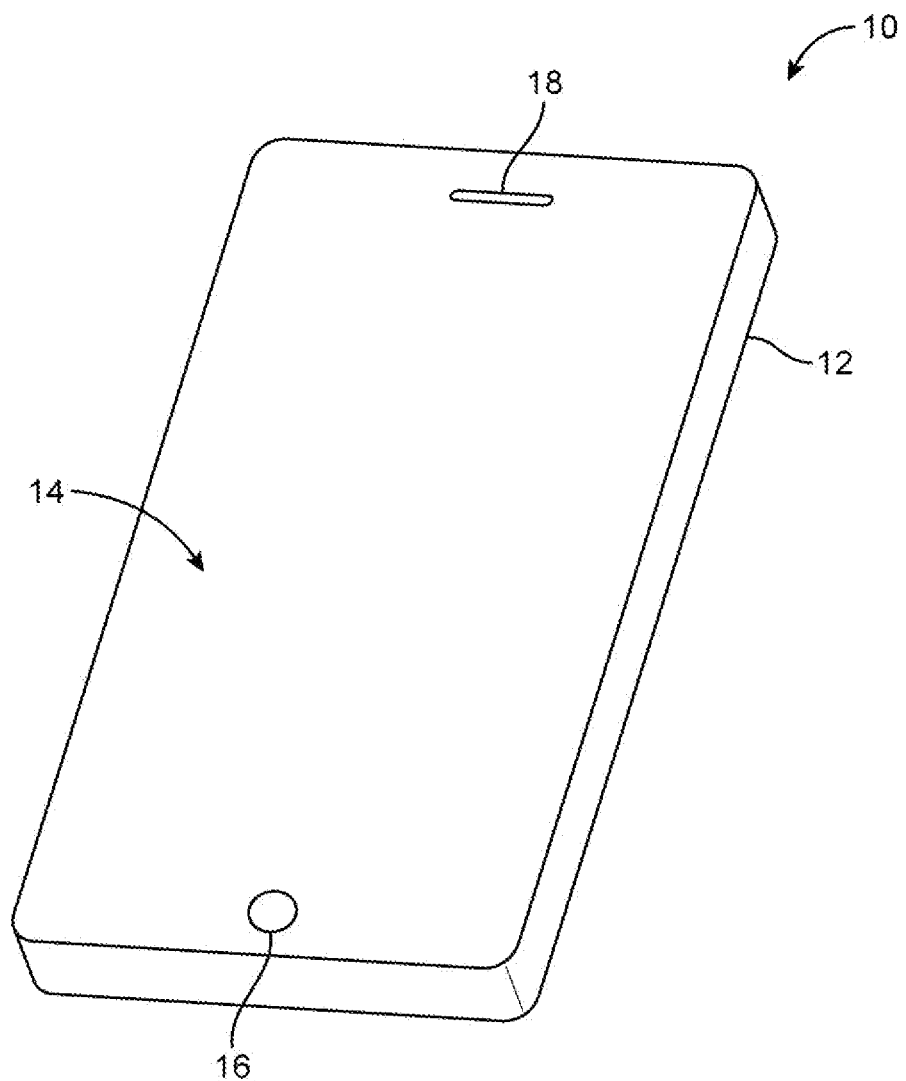
FIG. 1 is a perspective view of an illustrative electronic device such as a handheld computing device that may be provided with electromagnetic interference shielding structures in accordance with an embodiment.

FIG. 1 is a perspective view of an illustrative electronic device of the type that may contain electrical components mounted on substrates having electromagnetic interference shielding. An electronic device such as electronic device 10 of FIG. 1 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, or other portable computing device. Other configurations may be used for device 10 if desired. The example of FIG. 1 is merely illustrative.

In the example of FIG. 1, device 10 includes a display such as display 14. Display 14 has been mounted in a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.).

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18.

Figure 2:
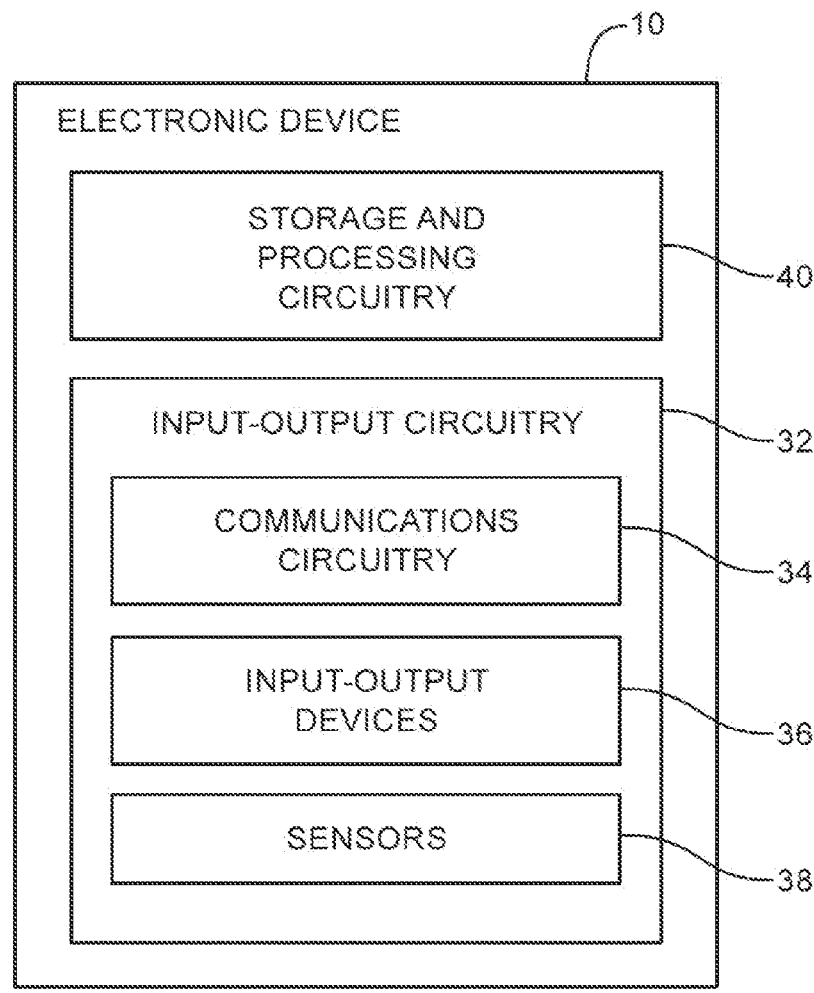
FIG. 2 is a schematic diagram of an illustrative electronic device that may be provided with electromagnetic interference shielding structures in accordance with an embodiment.

A schematic diagram of device 10 is shown in FIG. 2. As shown in FIG. 2, electronic device 10 may include control circuitry such as storage and processing circuitry 40. Storage and processing circuitry 40 may include one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 40 may be used in controlling the operation of device 10. The processing circuitry may be based on a processor such as a microprocessor and other suitable integrated circuits. With one suitable arrangement, storage and processing circuitry 40 may be used to run software on device 10 such as internet browsing applications, email applications, media playback applications, operating system functions, software for capturing and processing images, software implementing functions associated with gathering and processing sensor data, software that makes adjustments to display brightness and touch sensor functionality, etc.

Input-output circuitry 32 may be used to allow input to be supplied to device 10 from a user or external devices and to allow output to be provided from device 10 to the user or external devices.

Input-output circuitry 32 may include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 may include input-output devices 36 such as button 16 of FIG. 1, joysticks, click wheels, scrolling wheels, a touch screen such as display 14 of FIG. 1, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensor circuitry such as sensors 38 of FIG. 2 may include an ambient light sensor for gathering information on ambient light levels, proximity sensor components (e.g., light-based proximity sensors and/or proximity sensors based on other structures), accelerometers, gyroscopes, magnetic sensors, and other sensor structures.

Figure 3:
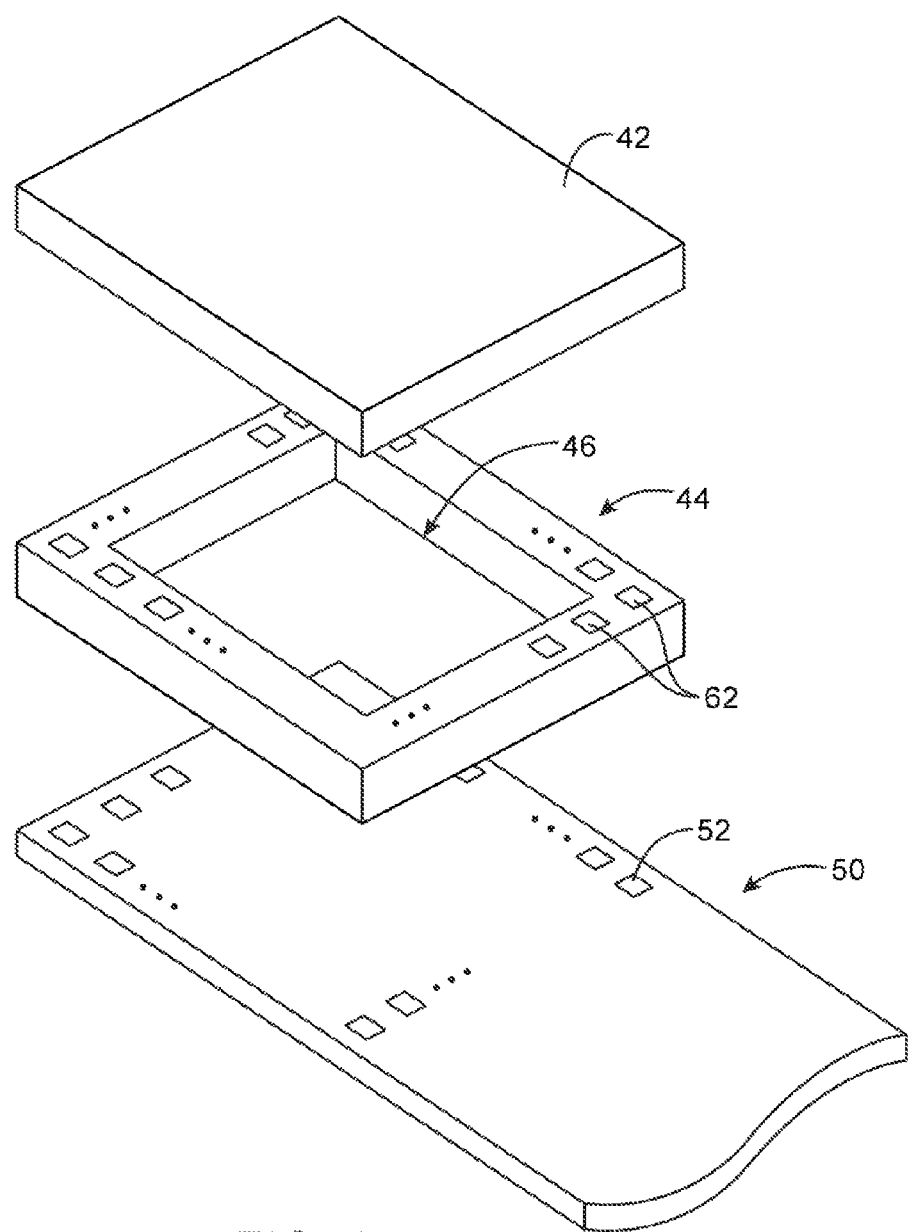
FIG. 3 is an exploded perspective view of an electrical component, a substrate to which the electrical component may be mounted, and a printed circuit to which the substrate may be mounted in accordance with an embodiment.

Control circuitry 40 and input-output circuitry 32 may contain electrical components such as integrated circuits and other components that are mounted on substrates. FIG. 3 is a perspective view of an illustrative component and associated mounting structures for device 10. As shown in FIG. 3, device 10 may have one or more electrical components such as electrical component 42. These electrical components may include one or more integrated circuits such as an image sensor integrated circuit, discrete components such as resistors, inductors, and capacitors, and other circuits. Components such as components 42 may be mounted to the upper and/or lower surfaces of substrate 44. Substrate 44, in turn, may be mounted on printed circuit 50.

One or more of components 42 may have a rectangular shape. Substrate 44 may have a corresponding rectangular outline. If desired, the center of substrate 44 may be provided with an opening such as rectangular opening 46 to accommodate light for an image sensor, to help prevent damage to a mounted component in event of a drop event, etc.).

Substrate 44 may be formed from ceramic or other dielectric materials. Contacts 62 may be provided on the upper surface of substrate 44. Contacts may also be provided on an opposing lower surface of substrate 44 (and, if desired, on a recessed ledge in substrate 44). With a configuration of the type shown in FIG. 3 in which substrate 44 has a rectangular ring shape surrounding a central rectangular opening such as opening 46, contacts 62 may include contacts that are arranged in a rectangular ring surrounding opening 46 (i.e., contacts 62 may run along each of the four edges of substrate 44). Contacts 62 may be formed from a conductive material such as metal. Vias may be used to couple contacts 62 to corresponding contacts on the underside of substrate 44. The underside contacts of substrate 44 may be configured to mate with corresponding contacts 52 on the upper surface of an additional substrate such as printed circuit 50. Contacts 52, which may be formed from metal, may be coupled to the contacts on the underside of substrate 44 using solder or other conductive material. Printed circuit 50 may be a rigid printed circuit board, a flexible printed circuit, or other substrate material. As an example, printed circuit 50 may be a flexible printed circuit having two or more dielectric layers and patterned metal traces. If desired, one or more openings may be formed in printed circuit 50.

Figure 4:
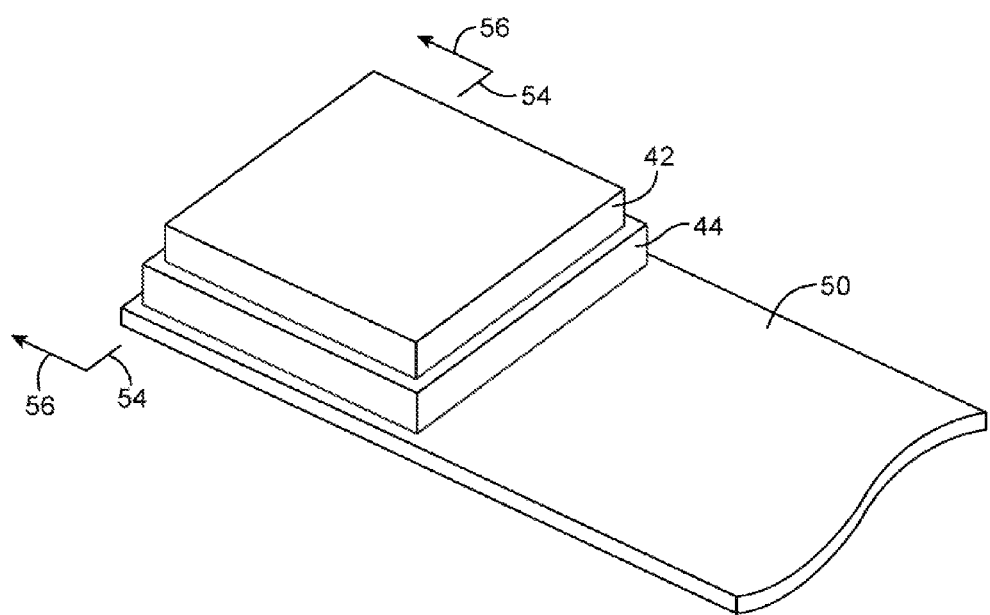
FIG. 4 is a perspective view of an illustrative electrical component mounted on a substrate that is mounted to a printed circuit in accordance with an embodiment.

When assembled, integrated circuit 42 is soldered or otherwise connected to the upper surface of substrate 44 and substrate 44 is soldered or otherwise connected to flexible printed circuit 50, as shown in the perspective view of FIG. 4. Flexible printed circuit 50 may have a portion that is terminated in a connector on a main logic board or may otherwise have portions that are routed to desired locations within device 10.

Figure 5:
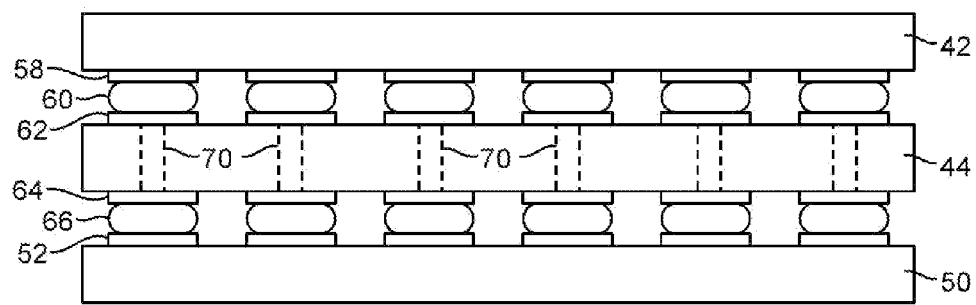
FIG. 5 is a cross-sectional side view of an illustrative electronic component mounted to a substrate that is mounted to a printed circuit in accordance with an embodiment.

A cross-sectional side view of the structures of FIG. 4 taken along line 54 and viewed in direction 56 is shown in FIG. 5. As shown in FIG. 5, component 42 may have contacts (terminals) such as contacts 58. Substrate 44 may have an upper surface with contacts 62 and a lower surface with contacts 64. Vias 70 may be used to electrically connect contacts 62 to respective contacts 64. Vias 70 may be formed by machining, laser drilling, or other hole formation techniques. Vias 70 may be metallized. For example, electroplating techniques may be used to form metal coatings on the inner walls of the holes used to form vias 70. Other hole formation and metal coating techniques may be used for forming vias 70, if desired. Printed circuit 50 may contain layers of dielectric and patterned metal traces for forming signal paths. Contacts 52 on the upper surface of printed circuit 50 may mate with contacts 64 on the lower surface of substrate 44.

Solder joints 60 may be used to couple contacts 58 on electrical component 42 to corresponding contacts 62 on substrate 44. Solder joints 66 may be used to couple contacts 64 on the lower surface of substrate 44 to contacts 52 on the upper surface of printed circuit 50. If desired, other conductive materials such as conductive adhesive may be used in mounting component 42 to substrate 44 and in mounting substrate 44 to printed circuit 50.

Figure 6:
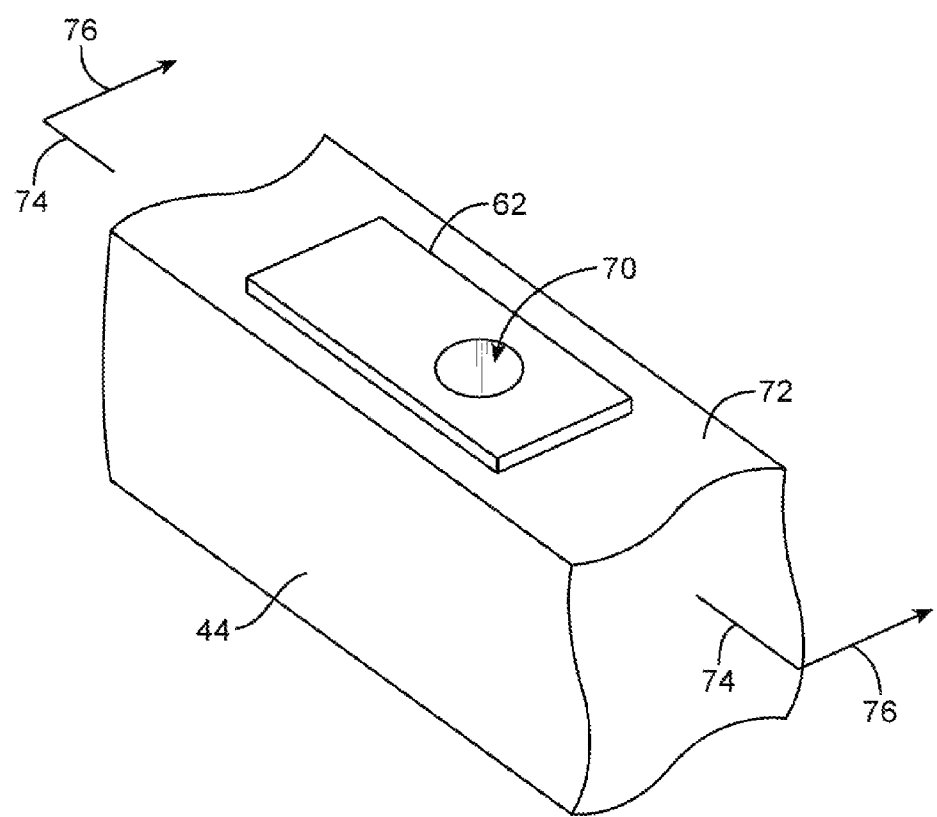
FIG. 6 is a perspective view of an edge portion of an illustrative substrate in accordance with an embodiment.

A perspective view of an edge portion of substrate 44 is shown in FIG. 6. As shown in FIG. 6, contact 62 may have a portion that overlaps and electrically connects with metal in via 70. The metal on the walls of via 70 may be used to connect contact 62 to a corresponding one of contacts 64 on the lower surface of substrate 44. If desired, vias 70 may be filled with metal (i.e., the hole forming each via 70 may be completely filled with metal). The illustrative configuration of FIG. 6 in which metal runs down the walls of via 70 is merely illustrative.

Figure 7:
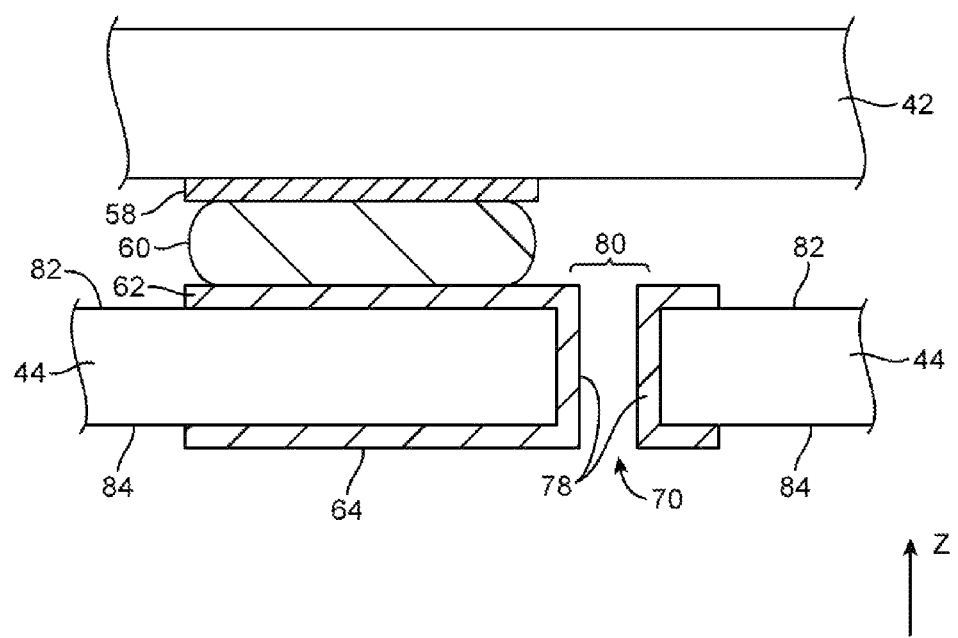
FIG. 7 is a cross-sectional side view of an edge portion of a substrate to which an electrical component has been soldered in accordance with an embodiment.

FIG. 7 is a cross-sectional side view of the structures of FIG. 6 taken along line 74 and viewed in direction 76 in a configuration in which component 42 has been mounted on substrate 44. As shown in FIG. 7, via 70 may be formed by metal coating 78 on the sidewalls of opening 80 in substrate 44. Opening 80 may be a cylindrical hole running along vertical axis Z of FIG. 7 or may be an opening with other suitable shapes. Sidewall metal coating 78 may be formed using electroplating (i.e., electrochemical deposition) or other suitable metal deposition techniques. Contact (solder pad) 62 is formed on upper surface 82 of substrate 44 and is connected to metal 78 of via 70. Contact (solder pad) 64 is formed on opposing lower surface 84 of substrate 44 and is also connected to metal 78 of via 70 (i.e., upper surface contact 62 is shorted to lower surface contact 64 through via 70). If desired, the interconnect structures in substrate 44 may include paths that interconnect adjacent paths, paths that allow contacts to be distributed across one or both surfaces of substrate 44 in a desired path, or other interconnect patterns. The arrangement of FIG. 7 is merely illustrative.

Substrates such as substrate 44 may be cut out of a large panel of substrate material. This allows some of the processing steps involved in forming substrate 44 to be consolidated and performed in an environment that is suitable for mass production. The process of cutting substrates 44 from a large panel of substrate material (i.e., cutting substrates 44 from a sheet of ceramic that is sufficiently large to be used in forming numerous individual ceramic substrates 44) is sometimes referred to as singulation. Singulation operations (dicing operations) may involve forming cuts through a ceramic panel using a saw or other cutting device. Openings such as opening 46 in the middle of each substrate 44 may, if desired, be formed during singulation operations.

It may be desirable to form electrical connections to the metal traces on substrate 44 such as contacts 62 and 64 and/or vias 70 prior to singulation (e.g., to facilitate electroplating, to perform continuity testing, etc.). Sacrificial metal traces may be used to form temporary signal paths. After contacts 62, 62, and vias 70 have been successfully tested, unused portions of the metal traces be cut away (i.e., the substrate panel may be singulated to form individual substrates 44). The metal traces may be formed on upper surface 82 and/or lower surface 84 of substrate 44. Configurations in which the metal traces are formed on lower surface 84 and are connected to contacts 64 are sometimes described herein as an example. This type of arrangement is, however, merely illustrative. Other types of metal trace patterns may be used if desired.

Figure 8:
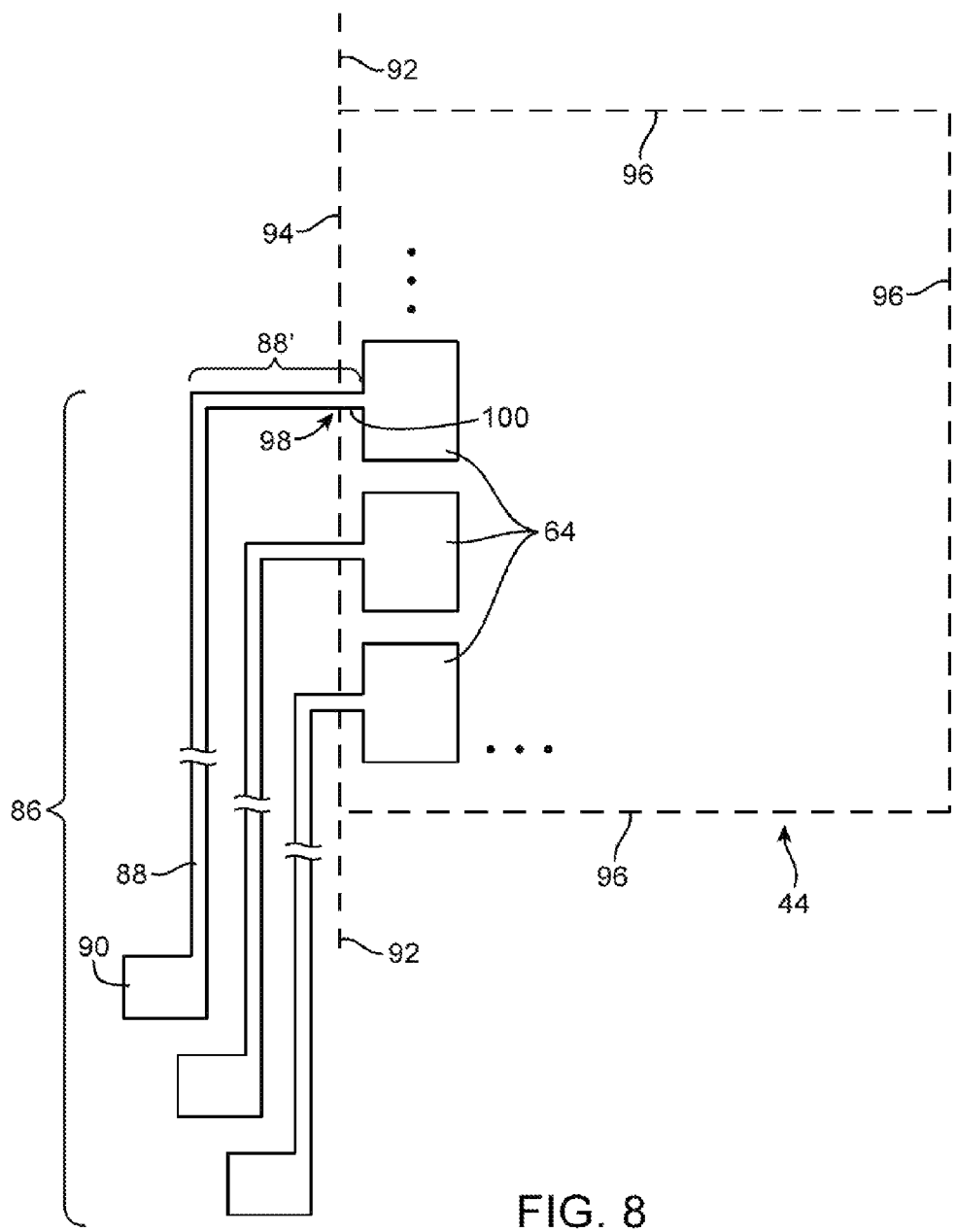
FIG. 8 is a top view of a portion of a sheet of substrate material showing how metal traces may be used to couple contacts on a substrate to external contact pads before the a substrate is cut out of the substrate material in accordance with an embodiment.

FIG. 8 is a bottom view of a portion of a ceramic panel prior to singulation to form substrate 44. As shown in FIG. 8, metal traces 86 form integral portions of the metal traces on substrate 44 that are used in forming contacts 64. Metal traces 86 include signal lines such as signal lines 88 and may include contacts such as test pads 90 to facilitate electroplating operations and continuity testing. During singulation, the ceramic panel may be sawn along saw lines such as saw line 94, thereby forming left-hand edge 94 of substrate 44. The panel may also be sawn along edges 96 (i.e., the right-hand edge, the upper edge, and the lower edge of substrate 44 in the orientation of FIG. 8) to release substrate 44 from the panel. If desired, an opening such as opening 46 may also be formed in substrate 44 during singulation.

When sawing the ceramic, the saw (e.g., a mechanical saw, laser, or other cutting device) cuts through metal traces 86. For example, lines 88 are cut in two (see, e.g., metal trace segment 88', which is cut at location 98). This cutting process leaves small unused segments of metal traces 86 on substrate 44, such as portion 100 of metal trace 88' along each edge of substrate 44.

Figure 9:
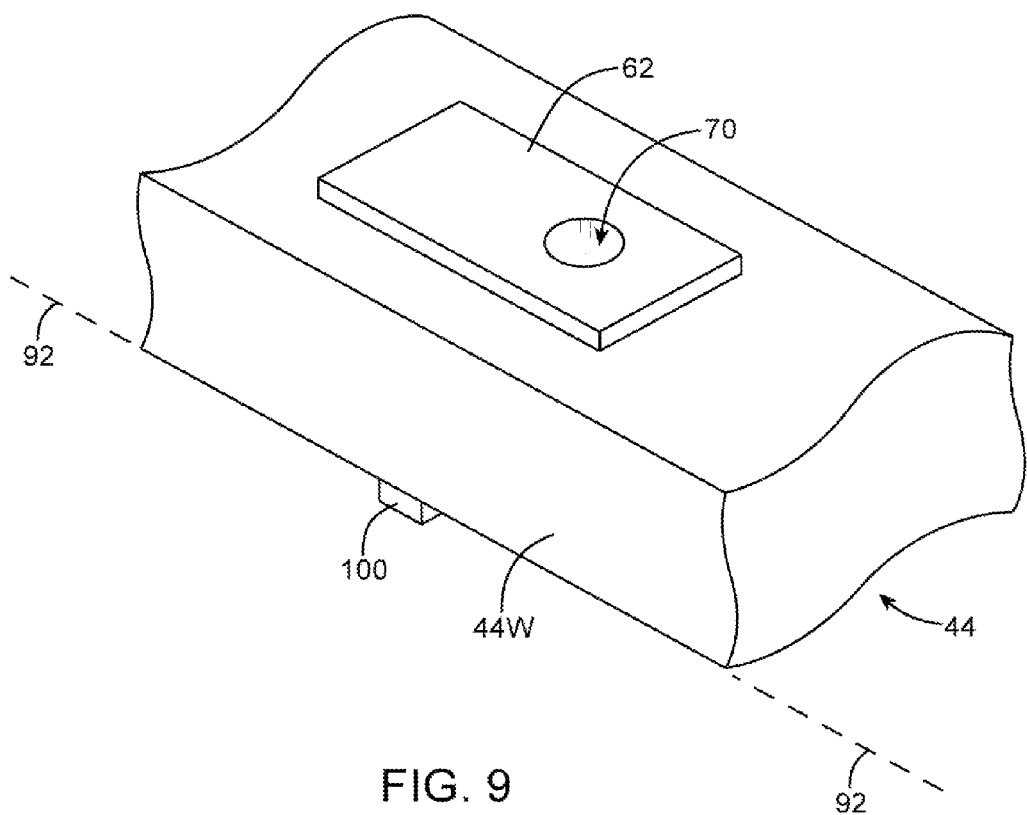
FIG. 9 is a perspective view of an edge portion of the substrate of FIG. 8 after the substrate has been cut out of a sheet of substrate material in accordance with an embodiment.

A perspective view of an illustrative edge of substrate 44 following singulation is shown in FIG. 9. As shown in FIG. 9, unused segment 100 of path 88' in sacrificial metal traces 86 remains on substrate 44 and is exposed along the bottom edge of outer wall 44W of substrate 44.

If traces such as trace 100 remain unshielded with metal shielding structures, it may be possible for electromagnetic interference signals to be emitted from substrate 44 during operation. These electromagnetic interference signals may interfere with the desired operation of device 10. Accordingly, edge shielding structures may be formed along the edges of substrate 44. The edge shielding structures may help prevent electromagnetic interference from leaking out of the metal traces on substrate 44.

The edge shielding structures may be formed by creating grooves or other openings that run along the edges of substrate 44 and electroplating or otherwise depositing metal on the surfaces of the grooves or other openings, thereby forming vertically extending sidewall metal structures. The sidewall metal structures serve as edge shields that block electromagnetic interference.

Figure 10:
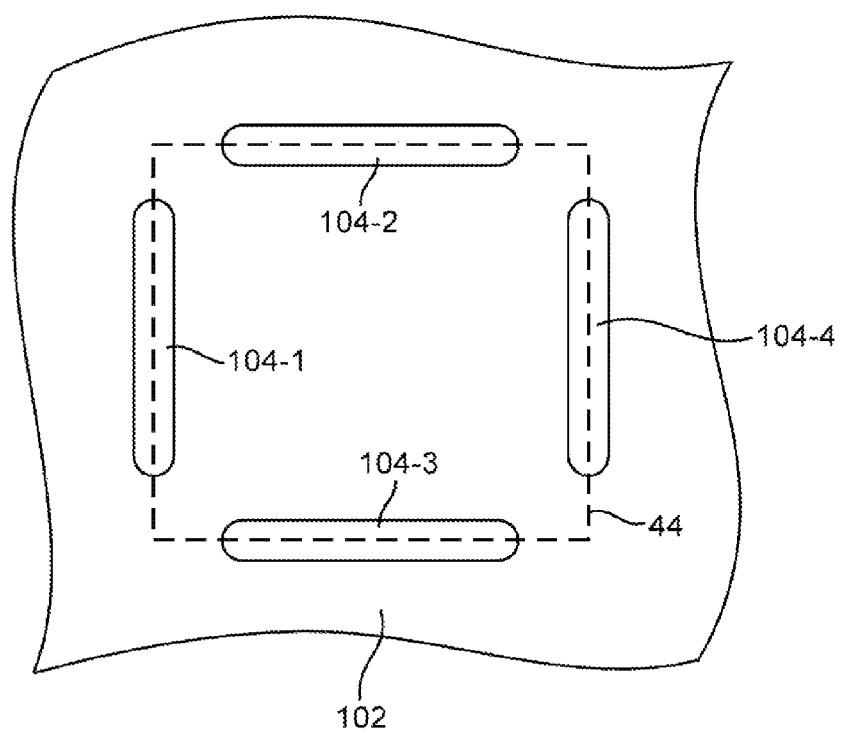
FIG. 10 is a top view of an illustrative sheet of substrate material that has been provided with grooves that run along the edges of a rectangular substrate to be cut from the sheet of material in accordance with an embodiment.

FIG. 10 is a top view of a portion of a ceramic panel prior to singulation along line 44 to form a substrate. As shown in FIG. 10, four grooves may be formed in ceramic panel 102. The surfaces of each groove (i.e., the sidewalls of each groove) may be electroplated or otherwise coated with metal. Groove 104-1 runs along the left-hand edge of substrate 44, groove 104-2 runs along the upper edge of substrate 44, groove 104-4 runs along the right-hand edge of substrate 44, and groove 104-3 runs along the lower edge of substrate 44. When substrate 44 is cut out of panel 102, the metal that remains on the innermost edge of each groove will form a metal shielding structure that shields an associated portion of the edge of substrate 44.

Figure 11:
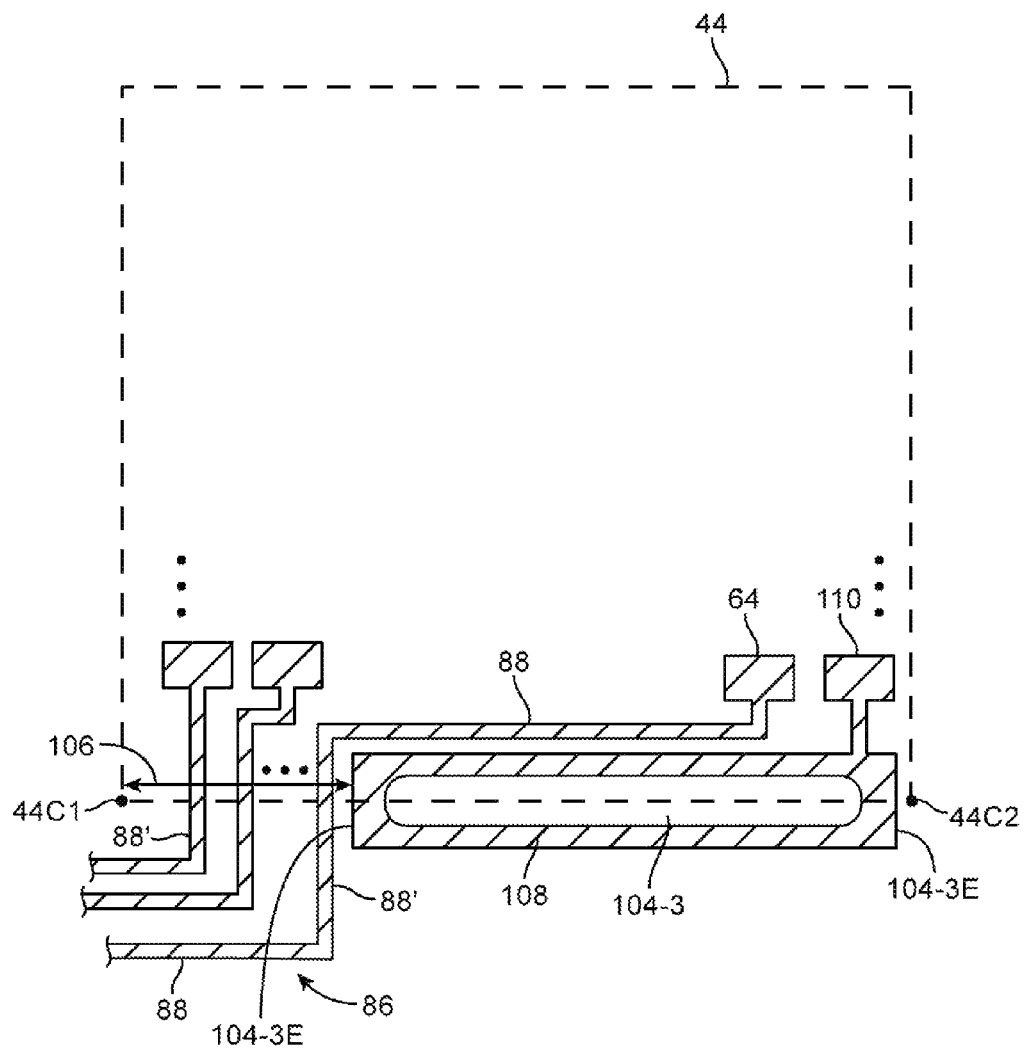
FIG. 11 is a bottom view of a sheet of substrate material with a groove that runs along the edge of a rectangular substrate to be cut from the sheet of material and having metal traces that are routed around the groove in accordance with an embodiment.

If desired, each groove may have one end that runs up to an associated corner of substrate 44 and another end that is recessed slightly from its nearest corner. The recessing of the end of each groove in this way provides a gap for signal lines associated with metal traces 86. FIG. 11 is a bottom view of an illustrative panel prior to singulation. As shown in FIG. 11, groove 104-3 may have a metal coating such as plated metal 108 that coats the walls of groove 104-3. Grounded trace 110 may be used to ground the metal on groove 104-3 (if desired).

End 104-3E of groove 104-3 is adjacent to corner 44C2 of substrate 44. Opposing end 104-3E of groove 104-3 is separated from opposing corner 44C1 of substrate 44 by gap 106. Metal traces 86 may have segments 88' that pass through gap 106. Along the portion of the edge of substrate 44 that is covered by groove 104-3, the metal on the inner surface of the groove will serve as an electromagnetic shield. Signal lines 88' in gap 106 will not be shielded by the metal in groove 104-3, but may be shielded by portions of a shield can, a bent tab of flexible printed circuit 50, or other shielding structures. All four sides of substrate 44 may be shielded using structures of the type shown in FIG. 11 or a subset of the sides of substrate 44 may be shielded using the configuration of FIG. 11. Shield can structures and other shielding structures may be used to enhance electromagnetic interference suppression.

Figure 12:
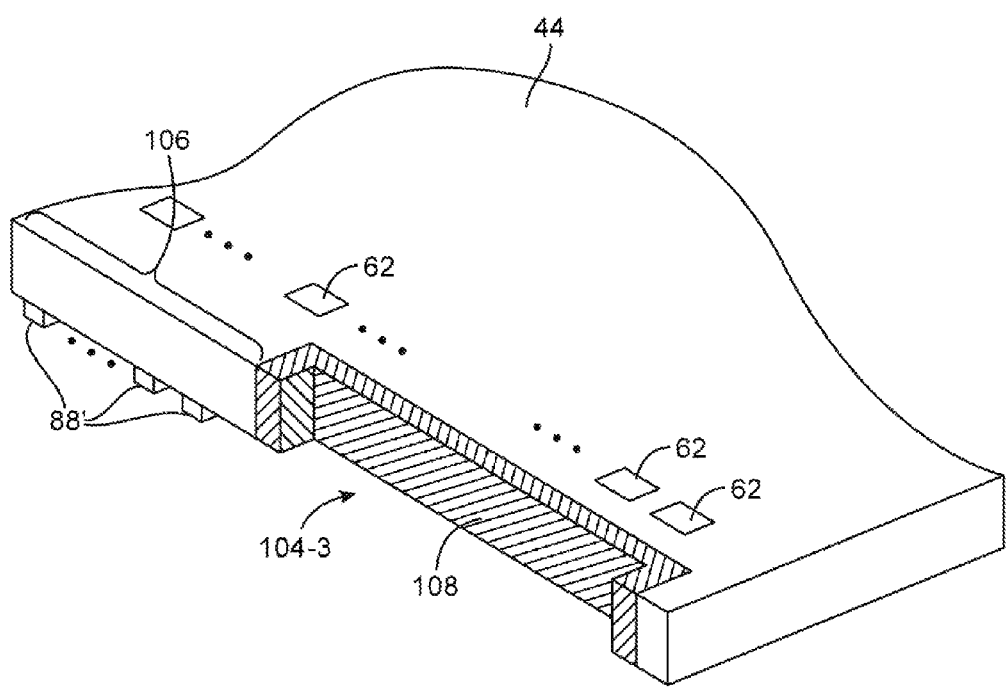
FIG. 12 is a perspective view of an edge portion of a substrate with edge shielding formed from a metallized groove that runs along the edge of the substrate in accordance with an embodiment.

FIG. 12 is a top perspective view of groove 104-3 of FIG. 11 after singulating the ceramic panel to form substrate 44 of FIG. 11. As shown in FIG. 12, cut traces 88' are present in gap 106 along the edge of substrate 44. Metal coating 108 on the inner surface of groove 104-3 serves as electromagnetic interference shielding for the rest of the edge of substrate 44. If desired, grooves such as groove 104-3 may have other shapes, may extend around one or more corners of device 10, etc. Because groove 104-3 of FIG. 12 has been split in two lengthwise along the edge of substrate 44, metal-coated grooves such as groove 104-3 of FIG. 12 are sometimes referred to as metal-coated split grooves, metal-coated half-grooves, or metal-coated divided grooves.

Figure 13:
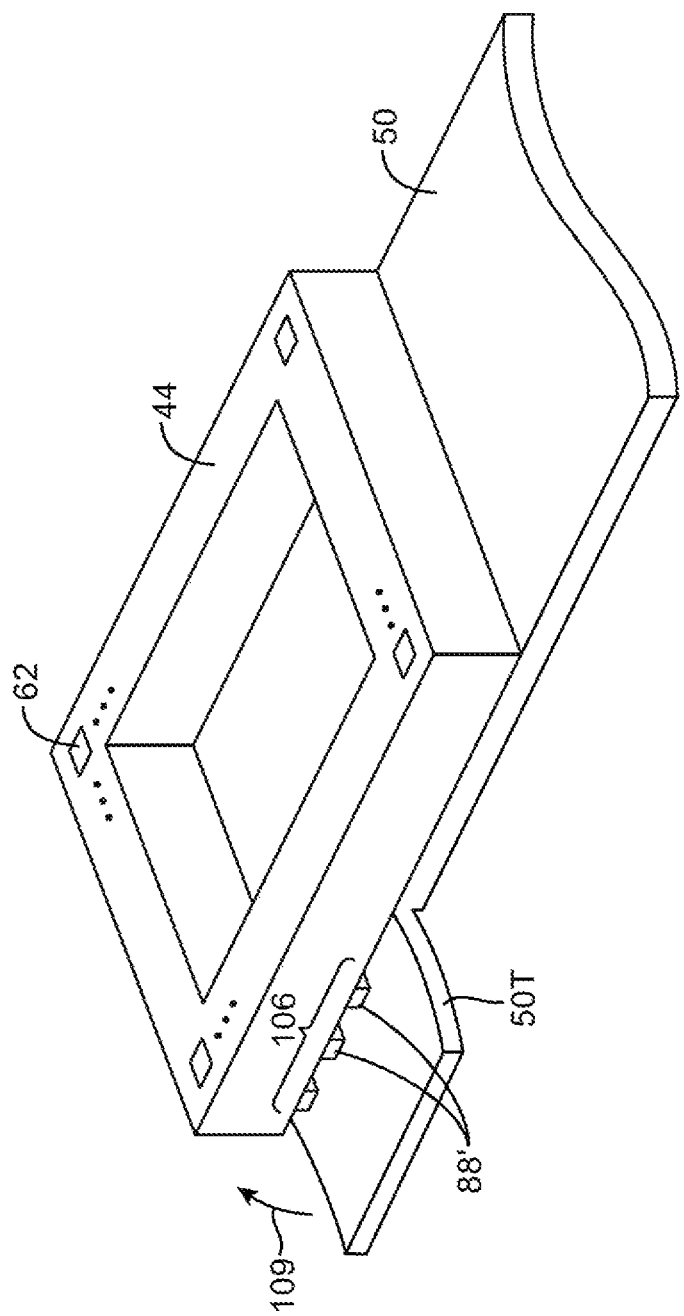
FIG. 13 is a perspective view of an illustrative substrate that has been mounted to a flexible printed circuit having a foldable tab for providing a corner of the substrate with shielding in accordance with an embodiment.
Figure 14:
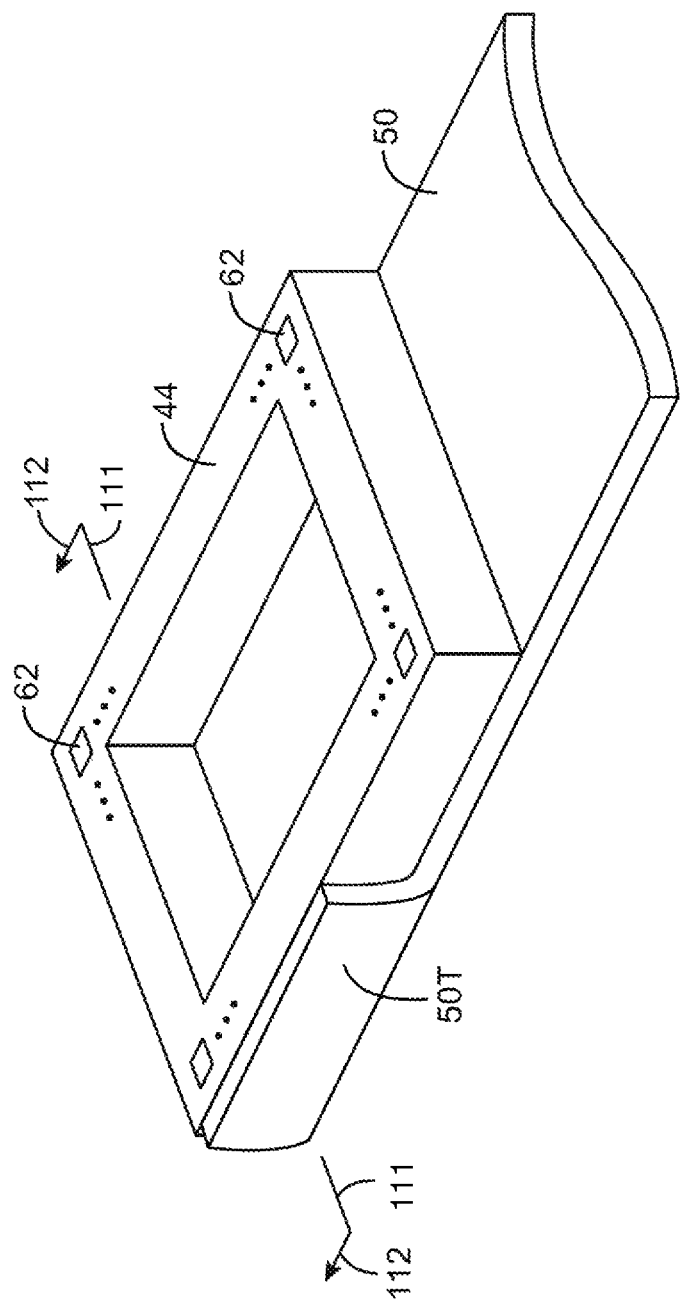
FIG. 14 is a perspective view of an illustrative substrate that has been mounted to a flexible printed circuit with a foldable shielding tab that has been folded up to cover and shield a corner portion of the substrate in accordance with an embodiment.

As shown in FIG. 13, printed circuit 50 may have a flexible protruding portion such as tab 50T that can be folded upwards in direction 109 and attached over traces 88' in gap 106 to shield traces 88'. FIG. 14 shows the structures of FIG. 14 following folding of tab 50T upwards against substrate 44. Conductive adhesive or other attachment structures may be used to hold tab 50T in place. Only part of the edge of substrate 44 is preferably covered by tab 50T, because groove shielding (see, e.g., metal 108 of groove 104-3 in FIG. 12) provides shielding for the remainder of the edge. As tab 50T extends only partway along the edge of substrate 44, tab 50T is easily folded upward against the edge of substrate 44 and does not exert excessive restoring force downwards following folding, enhancing reliability.

Figure 15:
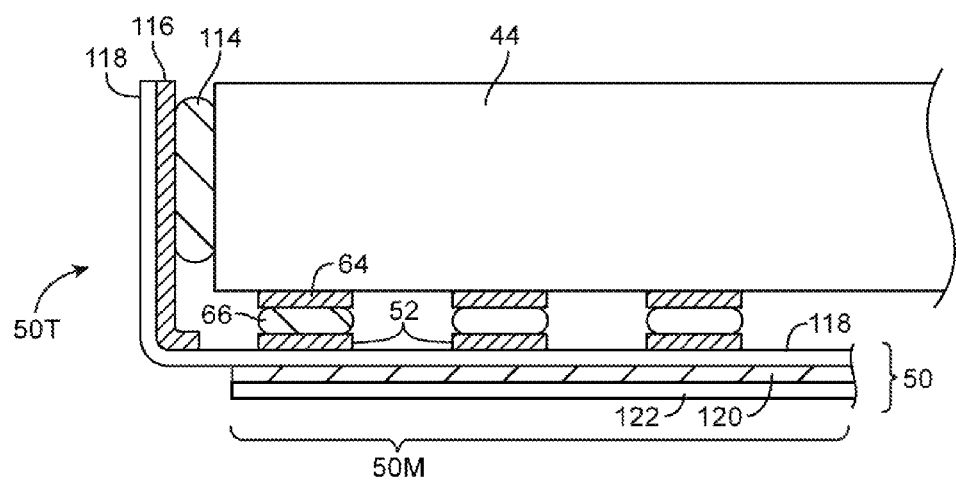
FIG. 15 is a cross-sectional side view of an edge portion of an illustrative substrate being shielded by a folded shielding tab on a flexible printed circuit in accordance with an embodiment.

A cross-sectional side view of substrate 44 of FIG. 14 taken along line 111 and viewed in direction 112 is shown in FIG. 15. As shown in FIG. 15, conductive adhesive 114 attaches tab 50T of printed circuit 50 along the edge of substrate 44. Tab 50T may be thinner than other portions of printed circuit 50. For example, main portion 50M of printed circuit 50 may have layers such as a first patterned metal layer that forms contacts 52, a first dielectric layer such as layer 118, a second patterned metal layer such as metal layer 120 that forms signal line traces for distributing signals within main portion 50M, and a second dielectric layer such as layer 122. Main portion 50M may also include other metal and dielectric layers, if desired. In tab 50T, fewer layers of material may be included (i.e., the thickness of printed circuit 50 in tab region 50T may be less than the thickness of printed circuit in main region 50M under substrate 44). As an example, tab 50T may include ground layer 116 that serves as an electromagnetic shielding layer covering all or most of tab 50T and a dielectric substrate layer such as a layer 118. The use of a thinned tab in printed circuit 50 may facilitate folding of tab 50T against the side of substrate 44.

Figure 16:
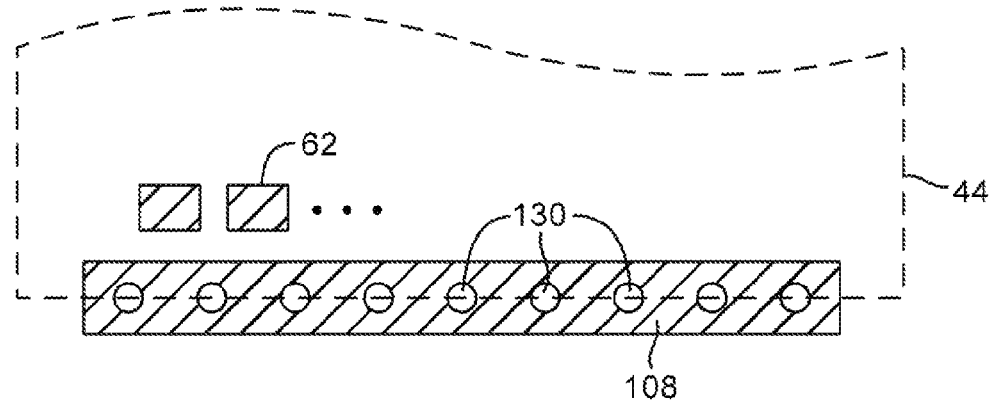
FIG. 16 is a top view of an illustrative substrate structure in which a row of metallized vias is used to provide edge shielding for a substrate in accordance with an embodiment.
Figure 17:
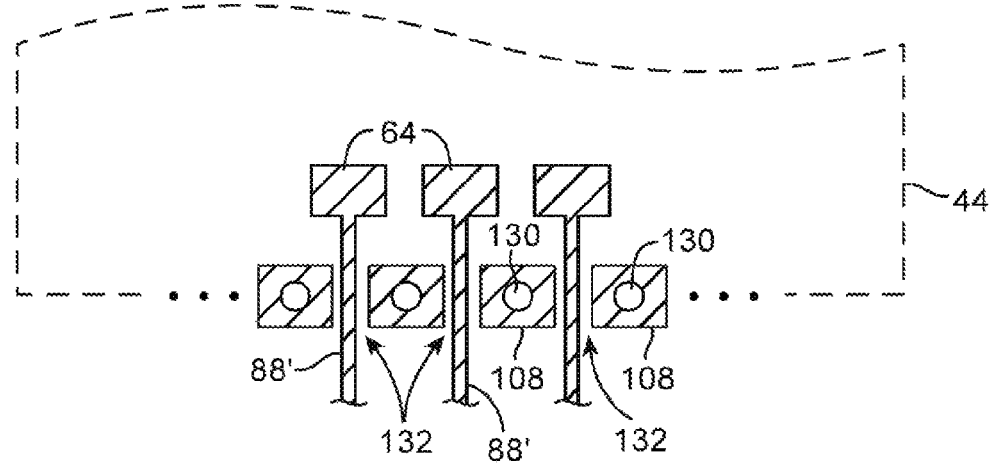
FIG. 17 is a bottom view of the structure of FIG. 16 showing how metal traces may be routed in the gaps between respective vias in a row of edge shielding vias for a substrate in accordance with an embodiment.

If desired, edge shields can be formed using rows of plated vias. FIG. 16 is a top view of an illustrative ceramic panel with a row of vias 130 that have been coated with metal 108 prior to singulation of substrate 44. FIG. 17 is a bottom view of the ceramic panel of FIG. 16 prior to singulation (i.e., prior to splitting the vias along the edge of substrate 44 to form a row of metal-coated divided vias (sometimes referred to as half vias or split vias). As shown in FIG. 17, vias 130 may be plated with metal or otherwise coated with metal 108. Gaps 132 may be formed between respective plated vias 130, so that metal traces 88' can protrude outwardly from contacts 64. Following singulation, metal on vias 130 of FIGS. 16 and 17 form edge shielding for substrate 44. The spacing between vias is preferably less than a quarter wavelength or more preferably less than an eighth or tenth of a wavelength of the radio-frequency electromagnetic interference signals to be suppressed by the shielding.

If desired, substrate 44 may use multiple types of shielding. For example, part of the edges of substrate 44 may be shielded using groove-based shields formed from one or more metal-coated divided grooves extending along the edges of substrate 44, part of the edges of substrate 44 may be shielded using shielding formed from a row of metal-coated divided vias running along the edges of substrate 44, and part of the edges of substrate 44 may be shielded by folded flexible printed circuit portions (e.g., a folded tab such as tab 50T that is an integral portion of a printed circuit such as a flexible printed circuit or that is a flexible printed circuit tail portion extending outward from a rigid printed circuit board portion in a "rigid flex" printed circuit, etc.). Shielding may also be provided using metal shielding can structures.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   a printed circuit;
   a substrate mounted on the printed circuit, wherein the substrate includes a via; and
   an electrical component mounted on the substrate, wherein the substrate has an outer-most edge, the outer-most edge comprises an outer-most surface and an additional surface, the additional surface at least partially defines a recess in the outer-most edge, a metal coating is formed on the additional surface, the outer-most surface and the additional surface at least partially define a perimeter of the substrate, the via is formed separately from and electrically isolated from the metal coating, and the via is shielded by the metal coating.

2. The apparatus defined in claim 1, wherein the additional surface is not parallel to the outer-most surface.

3. Apparatus, comprising:
   a ceramic substrate having an upper surface and an opposing lower surface and having vias that couple contacts on the upper surface to contacts on the lower surface;
   an integrated circuit soldered to the ceramic substrate, wherein the ceramic substrate is coated with metal edge shielding on an outer-most edge of the ceramic substrate and the outer-most edge couples the upper surface of the ceramic substrate to the lower surface of the ceramic substrate; and
   at least one divided groove that extends along the outer-most edge, wherein the metal edge shielding is formed on the divided groove, at least one via of the vias is formed in the ceramic substrate adjacent to the metal edge shielding, the at least one via is formed separately from the metal edge shielding, the divided groove is separated from a corner of the substrate by a gap, the ceramic substrate has at least one trace that extends from the at least one via to the outer-most edge in the gap, and the at least one trace is shielded by the metal edge shielding.

4. The apparatus defined in claim 3, wherein the divided groove has first and second opposing sides, wherein the first side is separated from the corner of the substrate by the gap, and wherein the second side is adjacent to an additional corner of the substrate.

5. The apparatus defined in claim 4, wherein no traces are formed between the second side of the divided groove and the additional corner.

6. The apparatus defined in claim 3, wherein the at least one via and the at least one trace are not shorted to the metal edge shielding.

7. Apparatus, comprising:
   a printed circuit;
   a substrate mounted on the printed circuit, wherein the substrate has a perimeter at least partially defined by an outer-most edge surface;
   an electrical component mounted on the substrate, wherein a groove through the substrate is formed along the outer-most edge surface, the groove has a surface that is substantially parallel to the outer-most edge surface and offset from the outer-most edge surface, and a metal coating is formed on the surface of the groove;
   a contact on an upper surface of the substrate, wherein the electrical component is soldered to the contact on the upper surface;
   a contact on a lower surface of the substrate, wherein the printed circuit is soldered to the contact on the lower surface; and
   a via that is electrically isolated from the metal coating that couples the contact on the upper surface of the substrate to the contact on the lower surface of the substrate, wherein the contact on the upper surface, the contact on the lower surface, and the via are positioned behind and shielded by the metal coating.

8. The apparatus defined in claim 7 wherein the substrate comprises a ceramic substrate.

9. The apparatus defined in claim 8 wherein the electrical component comprises an integrated circuit.

10. The apparatus defined in claim 8 further comprising metal traces that extend to the outer-most edge surface in a gap adjacent to the groove.

11. The apparatus defined in claim 10 wherein the printed circuit comprises a flexible printed circuit.

12. The apparatus defined in claim 11 wherein the electrical component comprises an integrated circuit and wherein the ceramic substrate has a rectangular opening.

13. The apparatus defined in claim 7, further comprising an additional surface that couples the outer-most edge surface to the surface of the groove, wherein the additional surface is substantially perpendicular to the outer-most edge surface and the surface of the groove.

14. The apparatus defined in claim 13, wherein the metal coating additionally coats the additional surface and a portion of the outer-most edge surface.

15. The apparatus defined in claim 14, wherein the metal coating additionally coats a portion of the upper surface and a portion of the lower surface.

* * * * *